United States Patent
Arai et al.

[19]

[11] Patent Number: 6,094,052
[45] Date of Patent: Jul. 25, 2000

[54] SURVIVOR CAPACITY MEASURING APPARATUS FOR A BATTERY

[75] Inventors: Yoichi Arai; Tsutomu Saigo, both of Shizuoka-ken, Japan

[73] Assignee: Yazaki Corporation, Tokyo, Japan

[21] Appl. No.: 09/061,905

[22] Filed: Apr. 17, 1998

[30] Foreign Application Priority Data

Apr. 18, 1997 [JP] Japan ..................................... 9-101912

[51] Int. Cl.$^7$ .......................... G01N 27/416; G01R 31/36
[52] U.S. Cl. ............................................ 324/428; 324/427
[58] Field of Search .................................. 324/426, 427, 324/428, 433

[56] References Cited

U.S. PATENT DOCUMENTS

| | | | |
|---|---|---|---|
| 5,648,717 | 7/1997 | Uskali | 324/428 |
| 5,744,963 | 4/1998 | Arai et al. | 324/427 |
| 5,761,072 | 6/1998 | Bardsley, Jr. et al. | 324/427 X |

FOREIGN PATENT DOCUMENTS

| | | |
|---|---|---|
| 7-45308 | 2/1995 | Japan . |
| 9-318717 | 12/1997 | Japan . |

*Primary Examiner*—Glenn W. Brown
*Attorney, Agent, or Firm*—Finnegan, Henderson, Farabow, Garrett & Dunner, L.L.P.

[57] ABSTRACT

A survivor capacity measuring apparatus for a battery is presented. The apparatus is constructed so as to determine whether or not the battery is deteriorated and indicates the result of this determination to a user. In the apparatus, a data read unit reads the current flowing from the battery to a load and the voltage of the battery. A survivor capacity calculation unit periodically collects the thus read current and voltage, detects the survivor capacity of the battery on the basis of the thus collected current and voltage, integrates the collected current, and determines the deterioration of the battery from a first survivor capacity of the battery before a predetermined amount has been reached and a second survivor capacity of the battery after the predetermined amount has been reached, when the integrated current has reached the predetermined amount.

10 Claims, 8 Drawing Sheets

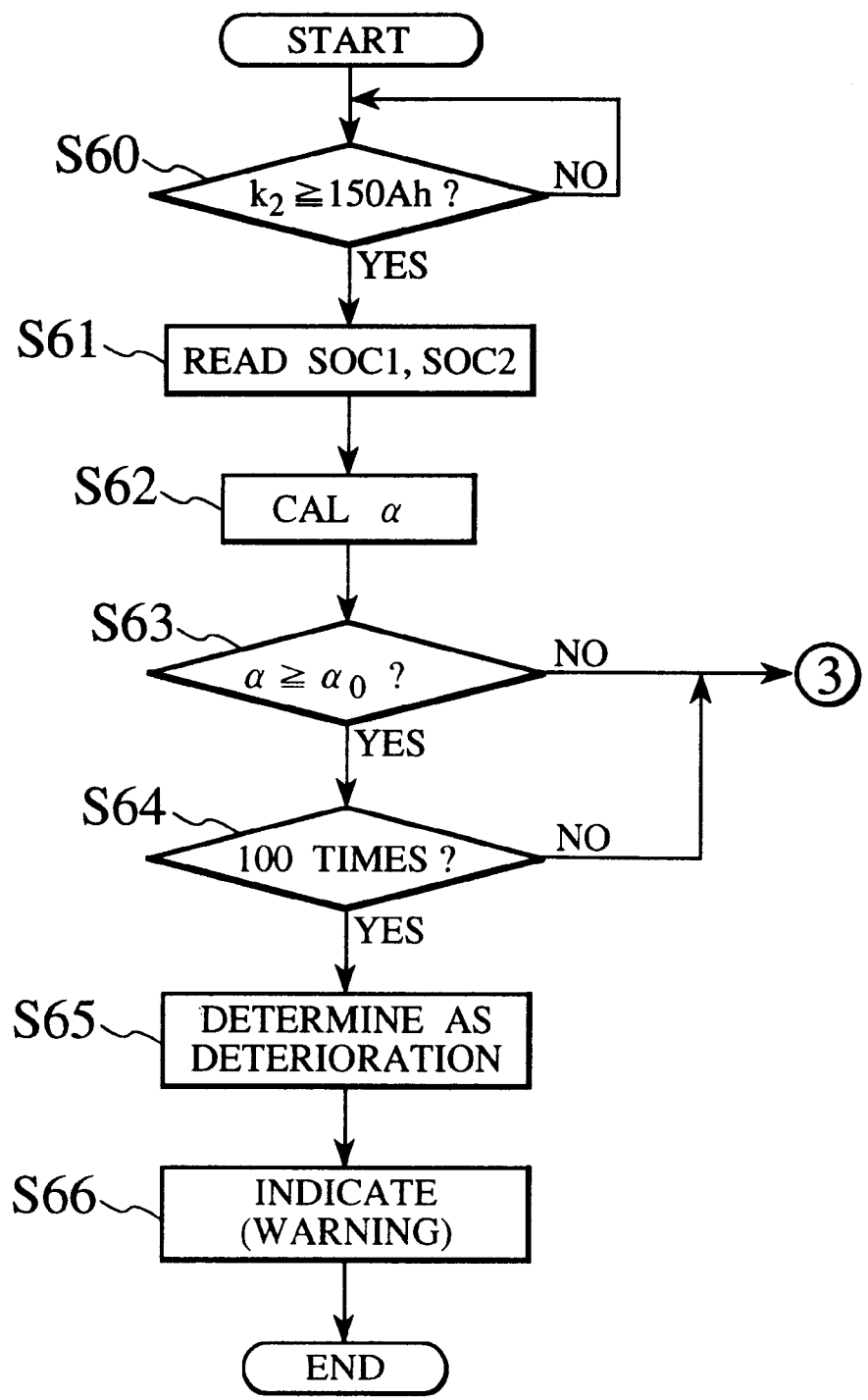

SURVIVOR CAPACITY MEASURING APPARATUS FOR A BATTERY

BACKGROUND OF THE INVENTION

1. Field of the Invention

The present invention relates to a survivor capacity measuring apparatus for a battery preferably applied to an electric automotive vehicle.

2. Description of the Related Art

Various proposals have so far been made concerning a survivor capacity measuring apparatus for a battery for accurately indicating the survivor capacity of the battery.

Further, recently a demand has been made to provide means for determining on the deterioration of the battery and indicating it to a user as well as for accurately indicating the survivor capacity of the battery.

In general, for making judgment on the deterioration of the battery, it is considered that there are the following two methods.

First, there can be pointed out the method according to which the deterioration of the battery is determined by the use of the relationship between the internal resistance and the amount of discharge of the battery, that is, the relationship that the amount of discharge increases in proportion to the increase in the internal resistance.

However, in the case of such a method, the result of the measurement varies depending on the temperature, how the charging and discharging proceed, etc., so that it is difficult to determine the deterioration of the battery in some cases.

Next pointed out is the method according to which the amount of discharge current with respect to the amount of charging current is measured, so that, by the use of the result of this measurement, the deterioration of the battery is determined, more concretely, the value obtained by dividing the amount of discharge current by the amount of charging current is taken up as the degree of deterioration of the battery.

However, according to such a method, an integration error is produced as in the case of measuring the survivor capacity of the battery by the use of the current integrating system.

In particular, in the case that a regenerative current is produced in an electric automobile or the like, when the travailing speed of said electric automobile or the like is reduced or when it is travailing along a downward slope, there is the tendency that the errors due to the regenerative current accumulate, and as a result, an accurate measurement can hardly be made.

In connection with the case where such a regenerative current is generated, it is considered to use a structure constructed in such a manner that the survivor capacity is measured by the use of the current integrating system only when the automobile is in a high load state (as in the case of travailing along an ascending slope or the like) during which no regenerative current is produced, but anyway such a method that is based on dividing the amount of discharge current by the amount of charging current cannot be said to be a timely and accurate measurement method.

SUMMARY OF THE INVENTION

It is the object of the present invention to provide a survivor capacity measuring apparatus for a battery which is constructed, in order to overcome the above-mentioned drawbacks, in such a manner that the survivor capacity of the battery can be accurately obtained and indicated, the deterioration of the battery can be determined, and the result of this determination can be indicated.

In order to achieve the above-mentioned object, in the survivor capacity measuring apparatus for a battery according to the present invention, a data read unit for reading the current flowing from a battery to a load connected to the battery and the voltage of the battery and a survivor capacity calculation unit which periodically collects the read current and voltage detects the survivor capacity of the battery on the basis of the thus collected current and voltage, integrates the collected current, and determines the deterioration of the battery, in the case that the integrated current has reached or exceeded a predetermined amount, from a first survivor capacity of the battery before the predetermined amount is reached and a second survivor capacity of the battery in the case that the predetermined amount is reached.

In the case that the survivor capacity measuring apparatus for a battery is constructed as mentioned above, it is ensured that, according to the time period when the current data and the voltage data of the battery are collected, the survivor capacity is obtained on the basis of these collected data, and in the case that the integrated amount of the current data has at least reached a predetermined amount, that is, the data has been equal to or more than the amount, the deterioration of the battery can be determined from a first survivor capacity before the predetermined amount is reached and a second survivor capacity in the case that the predetermined amount is reached, and therefore, the user can easily grasp the survivor capacity of the battery and the point of time when the battery should be replaced with a new one.

It is also desirable to constitute the survivor capacity measuring apparatus for a battery in such a manner that the survivor capacity measuring apparatus for a battery further comprises a regenerative current detection unit for detecting the generation of the regenerative current. In this case, the survivor capacity calculation unit determines whether or not the integrated amount has reached a predetermined amount in the case that the regenerative current is not produced.

In the case that the survivor capacity measuring apparatus for a battery is constituted as mentioned above, the deterioration of the battery can be determined even by the use of the survivor capacity when no regenerative current is being produced, so that the result of determination is more accurate.

Further, it is also desirable to constitute the survivor capacity measuring apparatus for a battery in such a manner that the survivor capacity calculation unit determines that the battery is deteriorated, when the value resulting from dividing the below-described subtraction amount by a predetermined amount of the integrated current is larger than or equal to a reference value. Here, the subtraction value is obtained by subtracting the second survivor capacity from the first survivor capacity.

In the case that the survivor capacity measuring apparatus for a battery is constituted as mentioned above, the gradient values from the first survivor capacity to the second survivor capacity when a predetermined amount of discharge is done can be obtained as the deterioration coefficient of the battery, and this deterioration coefficient is compared with a reference deterioration coefficient, so that, when the deterioration coefficient is higher than or equal to the reference deterioration coefficient, it is determined that the battery is deteriorated. That is, if the gradient between the first survivor capacity and the second survivor capacity when a predetermined amount of discharge is done is large, it is determined that the battery is deteriorated, and thus, an accurate determination result can surely be obtained.

Further, in the survivor capacity measuring apparatus for a battery, the survivor capacity calculation unit can be of the type which determines that the battery is deteriorated, when the value resulting from dividing the subtraction amount by the predetermined amount has reached or exceeded the reference value a predetermined number of times.

For instance, the survivor capacity calculation unit can be constituted in such a manner that it determines that the battery is deteriorated when the deterioration coefficient, according to the amount obtained by dividing the subtraction amount subtracting the second survivor capacity from the first survivor capacity by use of a predetermined amount, has reached or exceeded a reference deterioration coefficient one hundred times.

According to this constitution, it is ensured that, when the battery is truly deteriorated, it is determined that the battery is deteriorated, and thus, the reliability in the determination on the battery deterioration is enhanced.

Further, the survivor capacity calculation unit can further comprise a first unit which obtains the correlation coefficient between the current and the voltage, obtains an approximate straight line based on the current the voltage when the correlation coefficient indicates a strong negative correlation, and obtains an estimated voltage of the battery which is determined depending on the approximate straight line and a reference current value, a second unit which obtains the survivor capacity from the estimated voltage of the battery, and a third unit which determines whether or not the integrated current has reached or exceeded the predetermined amount, when the correlation coefficient indicates a strong correlation.

In case the survivor capacity calculation unit is constituted as mentioned above, the survivor capacity can be obtained with ease and with accuracy, and the structure of the measuring apparatus is also simplified.

Further, the survivor capacity measuring apparatus for a battery can be constituted so as to further have a regenerative current detection circuit which detects the generation of the regenerative current. Here the survivor capacity calculation unit erases, from the integrated current, a value corresponding to the generation of the regenerative current, when the generation of the regenerative current is detected. In this case, the influence by the regenerative operation can be eliminated, which is desirable.

Moreover, the survivor capacity measuring apparatus for a battery can similarly be constituted so as to has a regenerative current detection circuit which detects the generation of the regenerative current. Here, the survivor capacity calculation unit subtracts a value, in the survivor capacity, which corresponds to the generation of the regenerative current, when the generation of the regenerative current is detected. In this case, the influence by the regenerative operation can be eliminated: and thus, this constitution is desirable, too.

Further, the survivor capacity measuring apparatus for a battery can also be constituted in such a manner that the survivor capacity calculation unit activates, for example turns on and off, a warning indicator when it has determined that the battery is deteriorated. This constitution is also desirable in that the deterioration of the battery can be clearly indicated to the user.

Moreover, the survivor capacity measuring apparatus for a battery can further comprise an indicator unit for indicating the initial capacity of the battery, the survivor capacity of the battery and/or the occurrence of a regenerative operation. In this case, a convenience in use is added.

BRIEF DESCRIPTION OF THE DRAWINGS

FIG. 7 is a flowchart explaining the operation of the battery deterioration determining unit (determiner in FIG.1) of the same survivor capacity measuring apparatus for a battery.

DETAILED DESCRIPTION OF THE PREFERRED EMBODIMENT

Figure 1:
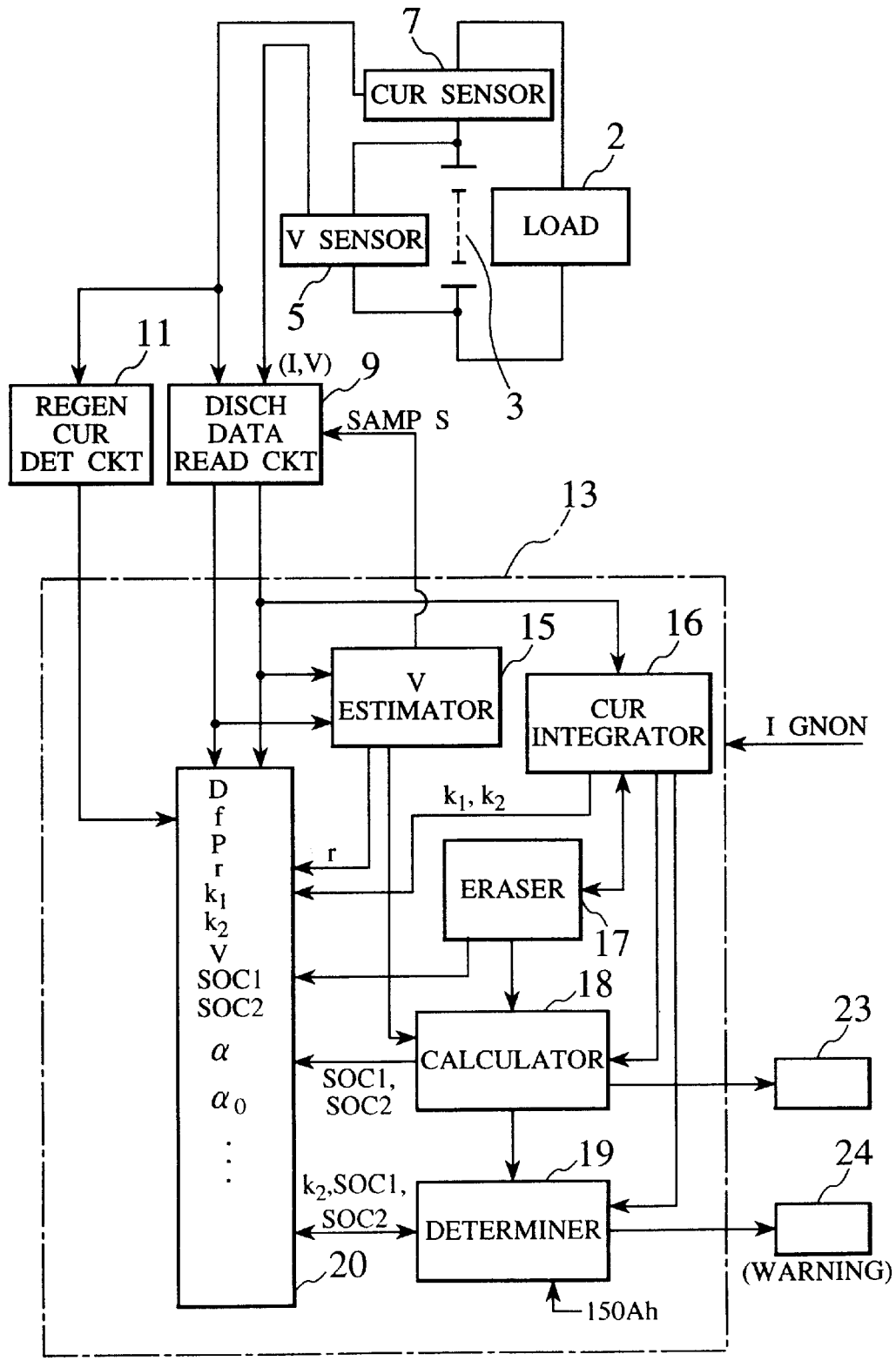
FIG. 1 is a block diagram of the survivor capacity measuring apparatus for a battery according to the present invention.

An embodiment of the present invention will now be described in detail, suitably referring to the drawings.

FIG. 1 is a schematic diagram showing the survivor capacity measuring apparatus for a battery according to an embodiment of the present invention.

Referring to FIG. 1, the reference numeral 1 denotes the survivor capacity measuring apparatus for a battery.

Here, the survivor capacity measuring apparatus 1 for a battery is mainly comprised of a voltage sensor 5 (V sensor) connected in parallel to the battery 3 for feeding electric power to a load 2 such as the main motor of an electric automobile etc., a current sensor 7 (cur sensor) for detecting the current flowing from the battery 3 to the load 2, a discharge data read circuit unit 9 (disch data read ckt) which, on the basis of a sampling signal, digitalize the voltage detected by the voltage sensor 5 and the current detected by the current sensor 7, respectively, a regenerative current detection circuit unit 11 which detects the generation of a regenerative current, and a survivor capacity calculation unit 13 which calculates the survivor capacity of the battery.

This survivor capacity measuring apparatus 1 for a battery determines the deterioration of the battery 3 and has the function of indicating the deterioration of the battery for the purpose of warning when said apparatus has determined that the batter is deteriorated.

Hereinafter, the respective component units and portions, particularly the survivor capacity calculation unit 13, of the survivor capacity measuring apparatus 1 for the battery will be described.

The survivor capacity calculation unit 13 is comprised of a battery voltage estimator unit 15, a current integrator unit 16, an integrated value eraser unit 17, a battery capacity calculator unit 18, a battery deterioration determiner unit 19, and a memory 20.

This battery voltage estimator unit 15 outputs a sampling signal (samp s in FIG. 1) to the discharge data read circuit unit 9 at every predetermined time and collects the current flowing from the battery 3 to the load 2 and the voltage of the battery 3 (these will hereinafter be generally called "collected data") to obtain a correlation coefficient r, and stores it in the memory 20.

Here, when this correlation coefficient r indicates a strong negative correlation, an approximate straight line (such as, e.g. V=aX+b) in the orthogonal coordinate system comprising a current axis and a voltage axis is obtained, so that, on the basis of this approximate straight line and a predetermined reference value, the voltage of the battery 3 is estimated, and at the same time, the battery capacity calculator unit 18 is started by the battery voltage estimator unit 15. This correlation coefficient r indicates the reliability of this approximate straight line and is reliable when it indicates a strong negative correlation.

Further, the current integrator unit 16 accumulates at every predetermined period the current flowing from the battery 3 to the load 2 (which will hereinafter be referred to as the integrated current amount k).

Here, this current integrator unit 16 stores, in the memory 20, an integrated amount substantially corresponding to the integrated current amount k in the section till the, generation of a regenerative current, as a first integrated current amount k1. And after the generation of the regenerative current stops, the integrated current amount k is stored in the memory 20 as a second integrated current amount k2.

Further, the integrated value eraser unit 17 erases, in the case that a regenerative current is detected, a predetermined amount from the integrated current amount k accumulated by the current integrator unit 16 and stored in the memory 20. For example, this erasure is a subtraction processing when the regenerative current is added to the integrated current amount k, but the erasure is an addition processing when the reverse is the case.

Further, the battery capacity calculator unit 18 detects the initial capacity of the battery 3 upon turn-on of the ignition, stores this initial capacity in the memory 20 and at the same time indicates it on an indicator unit 23. And while the electric automobile is running, the battery capacity calculator unit 18 detects the now existing survivor capacity (SOC) on the basis of the estimated voltage of the battery 3 obtained by the battery voltage estimator unit 15, stores it in the memory 20 and, at the same time, indicates it on the indicator unit 23.

Further, the battery deterioration determiner unit 19 determines that the battery is "deteriorated" in case, for instance, the reduction rate of the survivor capacity (SOC) has exceeded or reached a predetermined reference value a predetermined number of times. And in this case, the battery deterioration determiner unit 19 turns on and off a warning indicator 24.

Of course, the indicator unit 23 can indicate, in addition to the initial capacity and the survivor capacity, the fact that a regenerative operation is being caused, etc.

Further, in the memory 20, a regenerative current flag f indicating the generation of a regenerative current is set when the current from the current sensor 7 turns out to be negative and a regenerative current is detected.

The contents of the memory 20 will be described below in detail by the use of FIG. 2.

In this connection, it is added that the time setting etc. in the description to follow are used in this embodiment by way of an example.

Figure 2:
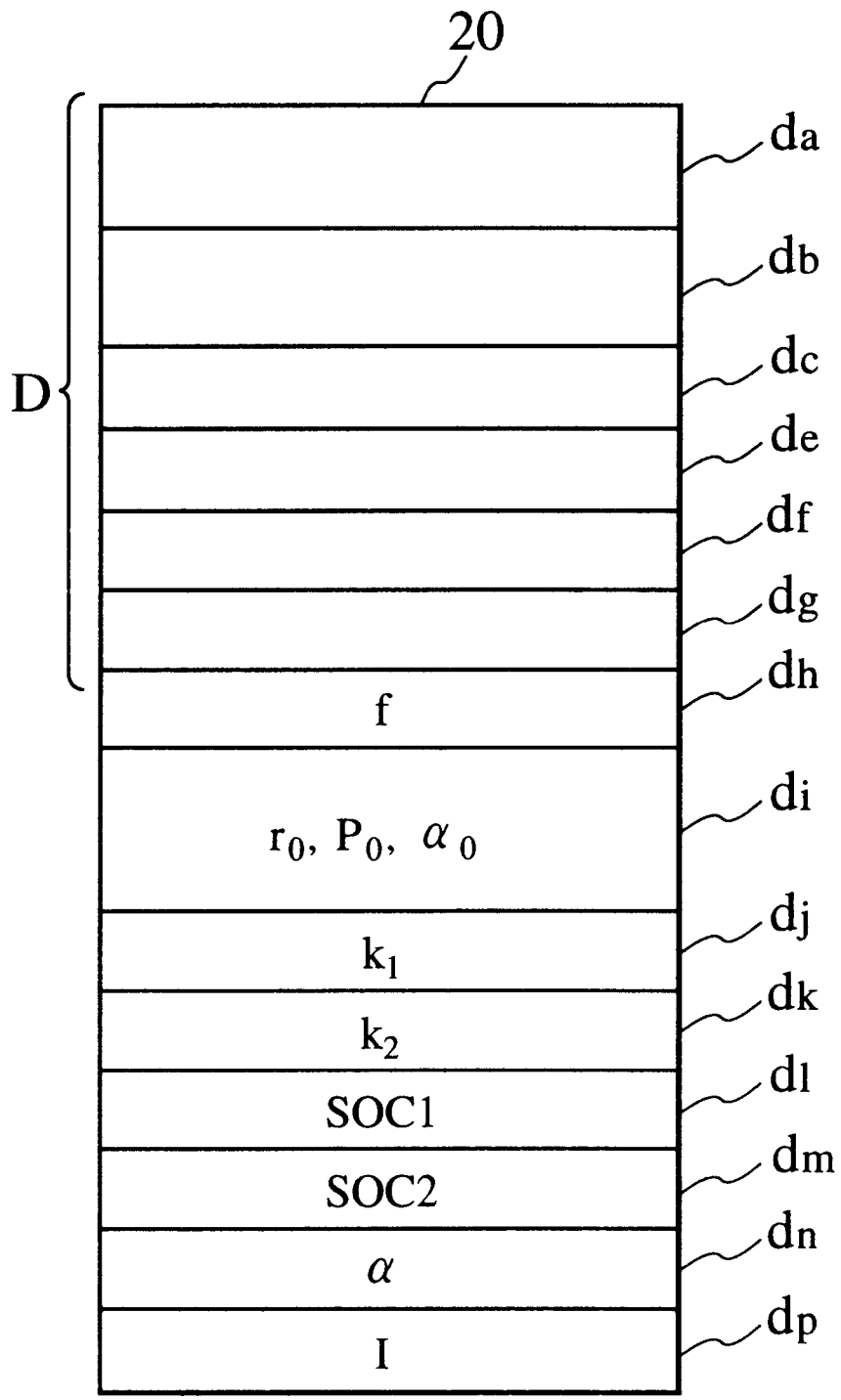
FIG. 2 is an explanatory diagram explaining the contents of the memory in the same survivor capacity measuring apparatus for a battery.

Referring to FIG. 2, the memory 20 is comprised of a current-voltage data area da in which the current-voltage data collected at every 1 (ms) are stored in an amount corresponding to 100 (ms), an average current-voltage value area db in which the average current and the average voltage at every 100 (ms) which are stored in said area da are stored in an amount corresponding to 10 (s), an integrated value area dc in which the integrated value of the average current and the integrated values of the average voltage in the area db are stored, an area de in which the product of the integrated value of the average current and the integrated value of the average voltage in the area dc is stored, a correlation coefficient area df in which the correlation coefficient r is stored, and a coefficient area dg in which the coefficients a and b of the approximate straight line are stored.

Various data D stored in these areas da to dg are for obtaining the approximate straight line such as, e.g. V=(aX+b) etc.

Moreover, referring to FIG. 2, the memory 20 further includes a regenerative flag area dh in which the regenerative current flag f is stored, a reference value storage area di in which a reference correlation coefficient ro, a reference integrated current amount Po for determining on the deterioration of the battery, and a reference capacity reduction rate (deterioration coefficient) αo of the battery 3 are stored, integrated current amount storage area dj and dk in which the first integrated current amount k1 and the second integrated current amount k2 are stored, respectively, and areas dl and dm in which SOC1 (Ah) and SOC2 (Ah) are respectively stored. That is, SOC1 is a survivor capacity during the period during which no regenerative current is generated in case no regenerative current is generated, or a survivor capacity which can safely be to substantially correspond to the survivor capacity during the period until a regenerative current is generated in case the regenerative current is generated, and SOC2 is a survivor capacity after the generation of the regenerative current stops.

Further, in the memory 20, there are provided an area dn in which the capacity reduction rate αo is stored and an area dp in which the current I flowing from the battery 3 to the load 2 is stored.

Figure 3:
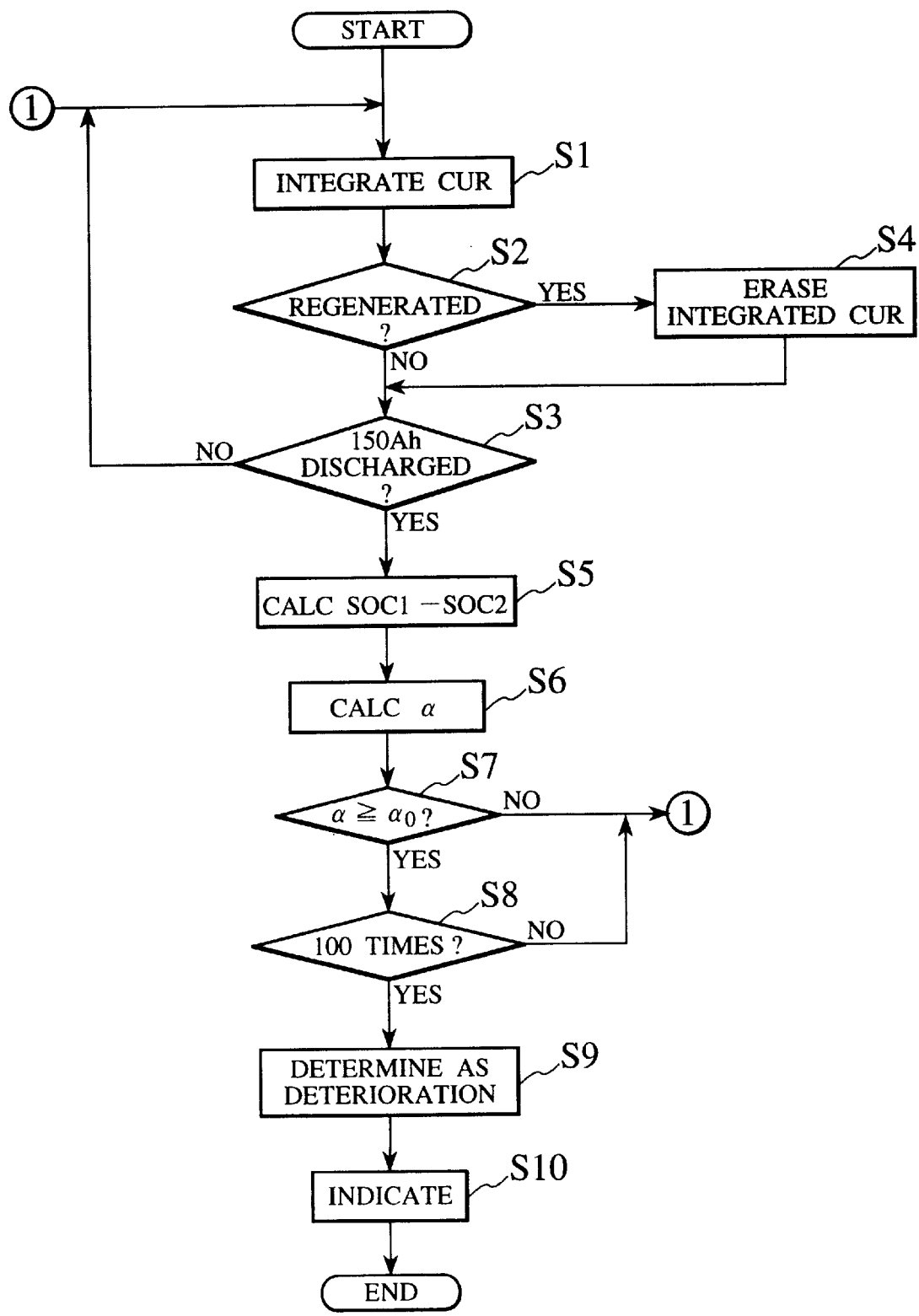
FIG. 3 is a flowchart for explaining the measurement performed by the same survivor capacity measuring apparatus for a battery.

The operation of the survivor capacity measuring apparatus 1 for a battery which is constituted as described above will be set forth below, referring to the flowchart shown in FIG. 3.

First, when the electric automobile starts to run, the current and voltage of the battery 3 which are output from the discharge data read circuit unit 9 are input to the survivor capacity calculation unit 13.

Next, at Step 1, the current integrator unit 16 accumulates the current of the battery 3 therein, and the current amount thus accumulated is stored as an integrated current amount k in the memory 20 (S1).

Next, at Step 2, the integrated value eraser unit 17 monitors whether or not the regenerative flag f is set up in the memory 20 (S2). That is, said integrated value eraser unit 17 monitors whether or not a regenerative current is generated and a regenerative operation is being effected.

Here, if, at Step 2, it is determined that no regenerative operation is performed, then, at Step 3, the battery deterioration determiner unit 19 determines whether or not the integrated current value k has reached, for instance,150 (Ah) (S3). In case said integrated current amount k has not reached 150 (Ah), the processing operation is returned to Step 1 to further obtain the integrated current amount.

On the other hand, in case, at Step 2, it is determined that a regenerative operation has been made, the integrated value eraser unit 17 erases a predetermined value from the integrated current amount k, and the processing operation is shifted to Step 3 (S4).

Now, here, before starting the description of Step 5, the operation of the battery voltage estimator unit 15 and the battery capacity calculator unit 18 will be described.

More concretely, the battery voltage estimator unit 15 and the battery capacity calculator unit 18 performs the following processing operation when the discharge data read circuit unit 9 collects the current and voltage of the battery 3.

First, the battery voltage estimator unit 15 perform processing operations such as the averaging of the current I and the voltage V in the memory 20 every time the current and voltage of the battery 3 are collected into the memory 20 plurality of times and the battery voltage estimator unit 15 obtains the correlation coefficient r from these data.

When this correlation coefficient r has become, for instance, $-0.9 \geq r \geq -1$ which indicates a strong correlation, an approximate straight line (such as, e.g. V=aX+b) which most clearly characterizes the tendency of correlation between the averaged current and the averaged voltage is detected, so that, on the basis of this approximate straight line, the estimated voltage of the battery 3 is obtained. Further, it is a matter of course that this approximate line may be obtained as I=aV+b.

Subsequently, the battery capacity calculator unit 18 obtains the survivor capacity as a first survivor capacity (SOC1) which substantially corresponds to the survivor capacity in the case where no regenerative current is detected and is based on the estimated voltage obtained by the battery voltage estimator unit 15, and stores the first survivor capacity in the memory 20. At the same time, the battery capacity calculator unit 18 indicates the first survivor capacity on the indicator. unit 23.

Since the integrated current amount k is erased by a predetermined amount during the period during which the regenerative current is being detected, this battery capacity calculator unit 18 indicates the survivor capacity obtained by suitably well known interpolating during such a period on the indicator unit 23.

Further, this battery capacity calculator unit 18 obtains the below-stated survivor capacity as a second survivor capacity (SOC2) on the basis of the estimated voltage obtained by the battery voltage estimator unit 15, the second survivor capacity being the survivor capacity after the lapse of a predetermined time after the storage of the survivor capacity SOC1 and being corresponding to the period during which no regenerative current is detected. And the battery capacity calculator unit 18 stores the second survivor capacity in the memory 20 and, at the same time, indicates the second survivor capacity on the indicator unit 23.

Here, returning to FIG. 3, in case, at Step 3, the battery deterioration determiner unit 19 has determined that the integrated current amount k has reached, for instance,150 (Ah) or higher, it is detected at Step 5 at what rate the survivor capacity reduces while150 (Ah) is discharged (S5).

This processing at Step 5 is, for instance according to a concrete example of this embodiment, to subtract the survivor Ecapacity SOC2 when150 (Ah) has been discharged, from the survivor capacity SOC substantially corresponding to the value until the regenerative current is generated; and, at Step 6, the value resulting from dividing the result of this processing by150 (Ah) is obtained as the capacity reduction rate α (S6).

Next, at Step 7, it is determined whether or not this capacity reduction rate α is larger than or equal to a reference capacity reduction rate (deterioration coefficient) αo (S7).

Next, in case it is determined at the Step 7 that the capacity reduction rate α is larger or equal to, it is determined at Step 8 whether or not it has been determined 100 times that the capacity reduction rate α is larger or equal to similarly every time (S8).

Next, in case it is determined at Step 8 that it has been determined one hundred times that the capacity reduction rate α is larger or equal to similarly, it is decided, at Step 9, that the battery is "deteriorated" (S9), and at Step 10, the indication of deterioration is executed (warned) by the use of the indicator 24 (S10).

Further, in case it is determined at Step 7 that the capacity reduction rate α is smaller than the reference capacity reduction rate αo, and in case it is not determined at Step 8 that it has not been determined one hundred times that the capacitate reduction rate α is larger or equal to similarly, the processing operation returns to Step 1.

Figure 4:
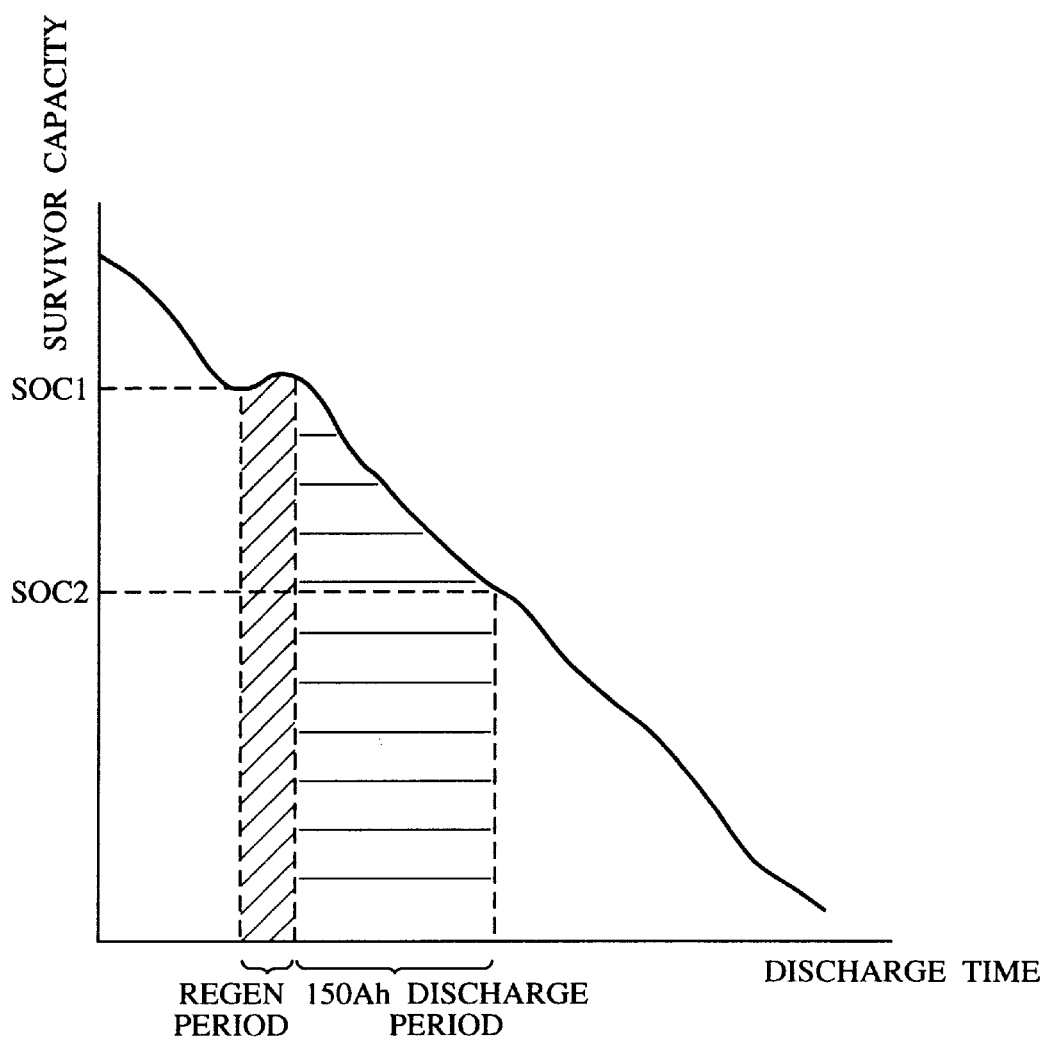
FIG. 4 is a schematic diagram showing the relationship between the discharge time and the survivor capacity for explaining the measurement performed by the same survivor capacity measuring apparatus for a battery.

An example of this determination will be described below in detail by the use of FIG. 4. As the automobile is running, the survivor capacity SOC is continuously obtained, and, if a regenerative operation is caused, the survivor capacity obtained by subtracting the regenerative capacity during the regeneration occurrence period, that is, the survivor capacity which corresponds to the value obtained by erasing the integrated current amount k during the period in which the regenerative operation is caused, is set as SOC1 in order to eliminate the influence by the regenerative operation.

Further, if it is assumed that a regenerative operation is caused, it turns out that the determination on the deterioration of the battery is made depending on whether the inclination of the straight line with respect to the survivor capacity SOC2 when said regenerative operation stops and the discharge amount of 150 (Ah) is reached is large or small.

Further, the flowchart shown in FIG. 3 will be described in detail by associating it with the respective component units and portions.

Figure 5:
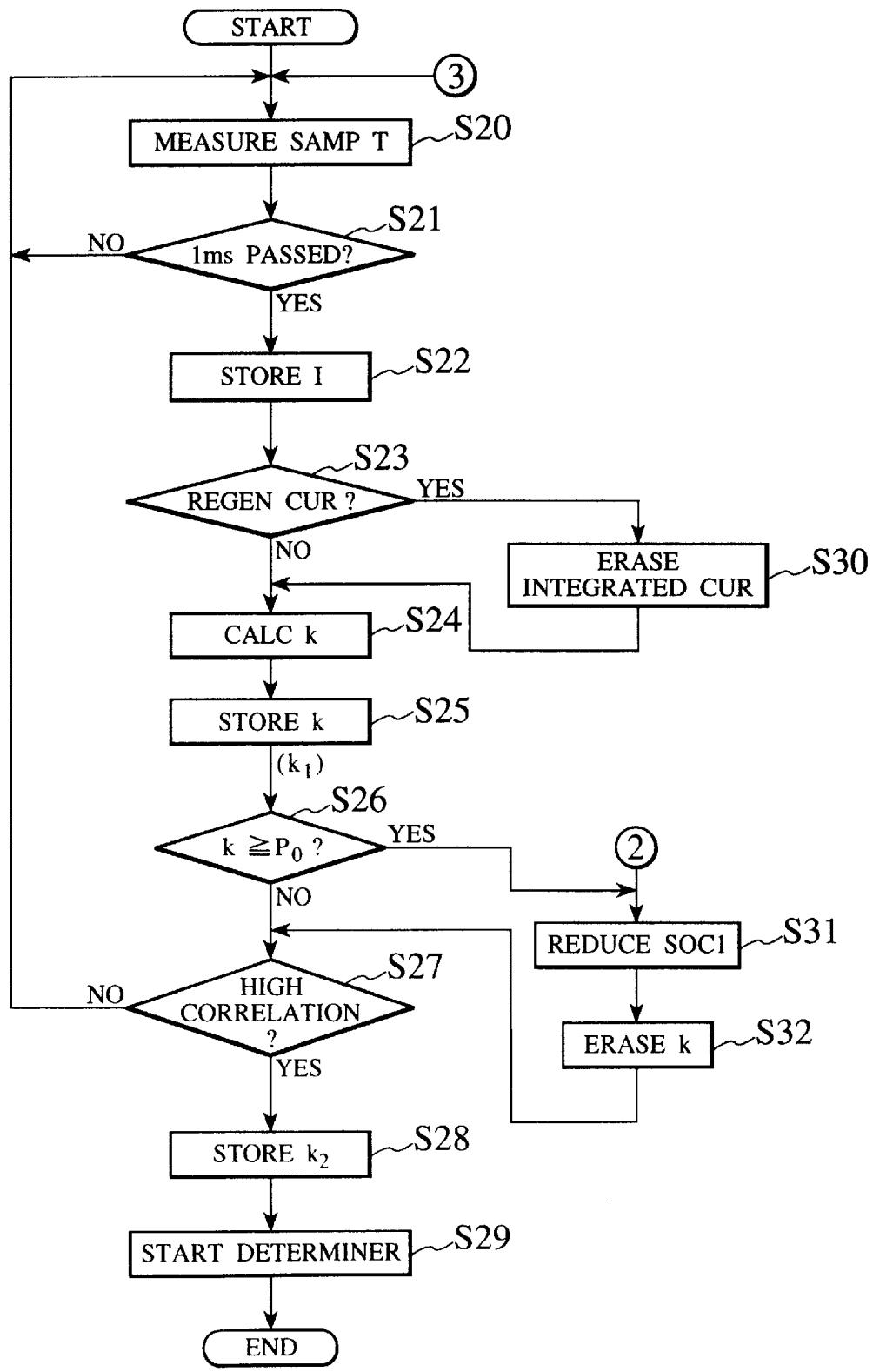
FIG. 5 is a flowchart explaining the operation of the current integrating unit (cur integrator in FIG.1) and the integrated value erasing unit (eraser in FIG.1) of the same survivor capacity measuring apparatus for a battery.

FIG. 5 shows a flowchart for explaining the operation of the current integrator unit 16 and the integrated value eraser unit 17.

Referring to FIG. 5, first at Step 20, the current integrator unit 16 measures a sampling time tn upon the starting caused by the turn-on of the ignition is measured (S20), and at Step 21, it is determined whether or not 1 (ms) has elapsed (S21).

Next, at Step 21, in case it is determined that 1 (ms) has passed, the current value I of the battery 3 is stored, at Step 22, in the area dp of the memory 20 by associating it with the time axis (S22).

Next, at Step 23, the integrated value eraser unit 17 determines whether or not a regenerative flag f is set up in the regenerative flag area dh of the memory 20, that is, whether or not a regenerative current has been detected (S23).

In case, at Step 23, it is determined that the regenerative flag f is not set up, that is, in case it is determined that no regenerative current flows, by the current integrator unit 16, an integrated current amount k (Ah) is obtained, at Step 24, from the current value I in the area dp of the memory 20 and the time elapsed (S24) and, at Step 25, this integrated current amount k is stored in the area d; of the memory 20 (S25).

Further, in case it is determined at Step 23 that a regenerative current flows, the integrated current amount k in the area dj of the memory 20 is erased, at Step 30, by a predetermined amount (S30). Then, the processing operation is shifted to Step 24 and Step 25, where the integrated current amount k is calculated and stored in the area dj of the memory 20.

Optimally, the integrated current amount k when a regenerative current is generated is erased by a predetermined amount, whereby said amount is made substantially equal to the first integrated current amount k1 before the regenerative current is generated. For instance, the erasure of this predetermined amount should preferably and simply be carried out in such a manner that an amount corresponding to 1% of the total capacity of the battery 3 is erased, in case the integrated current amount k during the period during which the regenerative operation is carried out corresponds to approximately 1% of the total capacity of the battery 3.

However, in case the influence by the regenerative operation substantially can be eliminated, the present invention is not limited to such an example.

Next, at Step 26, the integrated value eraser unit 17 determines whether or not the value k of the integrated current amount of the memory 20 has exceeded or reached a current time integration set value Po (hereinafter referred to simply as the set value Po) (S26). This process is taken for coping with such a situation that, in case the integrated current amount has exceeded or reached the predetermined value for some cause or other, in spite of the fact that a regenerative operation is caused, it is substantially not detected.

Here, according to the embodiment of the present invention, this set value is selected so as to correspond to 1% of the total capacity of the battery 3.

Next, in case, at Step 26, it is determined that the integrated current amount k does not exceed the set value Po, the correlation coefficient r in the correlation coefficient area df of the memory 20 is read at Step 27 to determine whether or not this correlation coefficient r indicates a strong negative correlation (such as, e.g. $-0.9 \geq r \geq -1$) by the current integrator unit 16 (S27).

In case, at Step 27, it is determined that no strong negative correlation coefficient is indicated, the processing operation is returned to Step 20.

Or, in case it is determined at Step 27 that a strong negative correlation is indicated, the integrated current amount k obtained by the current integrator unit 16 is stored, at Step 28, as a second integrated current amount k2 in the area dk of the memory 20 (S28), and at Step 29, the battery deterioration determiner unit 19 is started (S29).

In case, at Step 26, it is determined that the integrated current amount k has exceeded or reached the set value Po, the integrated value eraser unit 17 subtracts, at Stp 31, a value corresponding to, for instance, 1% of the total capacity of the battery 3 from the survivor capacity SOCI stored in the memory 20 (S31), and at the same time, at Step 32, the portion — of the integrated current amount k stored in the memory 20—which corresponds to 1% of the total capacity, for instance, the portion corresponding to the period during which the regenerative operation is caused is subtracted, and then, the proceeding operation is returned to Step 27 (S32).

Figure 6:
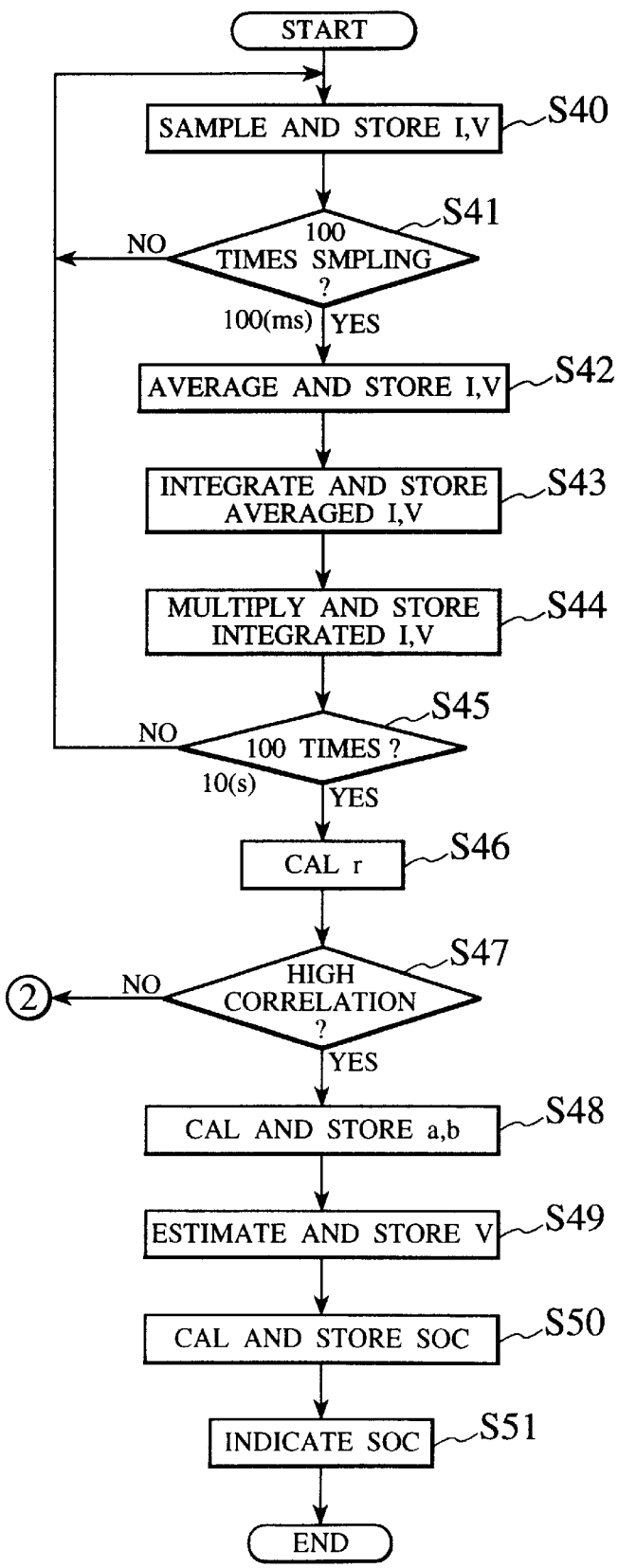
FIG. 6 is a flowchart explaining the processing operation performed by the battery voltage estimation unit (V estimator in FIG. 1) and the battery capacity calculation unit (calculator in FIG. 1) of the same survivor capacity measuring apparatus for a battery.

The processing operation of the battery voltage estimator unit 15 and the battery capacity calculator unit 18 will be described below by the use of the flowchart shown in FIG. 6.

First, at Step 40, the battery voltage estimator unit 15 samples, upon starting, the current I and the voltage V of the battery 3 at every 1 (ms) and stores them in the current-voltage data area da of the memory 20 (S40).

Next, at Step 41, it is determined whether or not sampling has been made, for instance, one hundred times by the battery voltage estimator unit 15 (S41).

Next, in case it is determined, at Step 41, sampling has been made one hundred times, the battery voltage estimator unit 15 averages, at Step 42, the current I and the voltage V of the memory 20 with respect to the samplings made one hundred times and stores the averaged current and voltage in the average current-voltage value area db of the memory 20 (S42).

In case, at Step 41, it is determined that one hundred samplings have not been done, the processing operation is shifted to Step 40, so that the current and the voltage are sampled at every 1 (ms) as mentioned above.

Next, by the battery voltage estimator unit 15 at Step 43, the integrated value of the averaged current and the integrated value of the averaged voltage are obtained and stored in the integrated value area dc of the memory 20 (S43), and further, by the battery voltage estimator unit 15 at Step 44, the product of said integrated current and said integrated voltage is obtained and stored in the area de of the memory 20 (S44).

Next, at Step 45, it is determined whether or not the respective average values of the current and the voltage have been obtained one hundred times by the battery voltage estimator unit 15 (S45).

In case, at Step 45, it is determined that one hundred average values have not been obtained, the processing operation is shifted to Step 40, so that the current and the voltage are sampled at every 1 (ms) as mentioned above.

Further, in case, at Step 45, it is determined that one hundred average values have been obtained, the correlation coefficient r is obtained, at Step 46, from the plurality of averaged currents and averaged voltages, etc. during the period of 10 (s), both of which are stored in the memory 20, by the battery voltage estimator unit 15 (S46).

Next, at Step 47, it is determined whether or not the correlation coefficient r indicates a high correlation by the battery voltage estimator unit 15 (S47). For instance, according to this embodiment, it is determined that the correlation coefficient r indicates a high correlation in case it becomes $-0.9 \geq r \geq -1$.

Next, in case, at Step 47, it is determined that the correlation coefficient r indicates a high correlation, an approximate straight line, which most highly characterizes the tendency of correlation between the averaged current and the averaged voltage during the period of 10 (s) both of which are stored in the memory 20, is obtained, at Step 48, as V=aX+b or 1=aV+b by the use of, for instance, the method of least squares, and the coefficients of the thus obtained approximate straight line are stored in the area dg of the memory 20 (S48), and further, at Step 49, the point thereof intersecting the reference current value Io (for instance, Io=−10A) is obtained as an estimated voltage and stored in the memory 20, by the battery voltage estimator unit 15 (S49).

Next, at Step 50, the battery capacity calculator unit 18 obtains the existing survivor capacity SOC of the battery 3 on the basis of this estimated voltage and stores the existing survivor capacity SOC in the memory 20 (S50), and further, at Step 51, indicates on the indicator unit 23 (S51).

This survivor capacity SOC is stored in the area dl of the memory 20 as the survivor capacity SOC1 made to substantially correspond to the value when the regenerative current substantially is not generated, and when the integrated current amount exceeds or reaches 150 (Ah) in the case that the regenerative current substantially is not generated, the survivor capacity SOC when the integrated current amount reaches 150 (Ah) is stored in the area dm of the memory 20 as the survivor capacity SOC2.

Further, in case it is determined at Step 47 that the correlation coefficient r indicates no high correlation, the processing operation shifts to Step 31 shown in FIG. 5.

Next, the operation of the battery deterioration determiner unit 19 will be described in detail by the use of the flowchart shown in FIG. 7.

First, at Step 60, the battery deterioration determiner unit 19 reads the integrated current amount k2 in the memory 20 and monitors whether or not this integrated current amount k2 has exceeded or reached 150 (Ah) (S60).

Next, in case that it is determined, at Step 60, that the integrated current amount k2 has reached 150 (Ah), at Step 61, the survivor capacity SOC1 and the survivor capacity SOC2 stored in the memory 20 are read (S61).

Next, at Step 62, the capacity reduction rate α is obtained (S62).

Here, according to this embodiment, it is set that α=(SOC1−SOC2)/150.

Next, at Step 63, it is determined whether or not this capacity reduction rate α is larger than the reference reduction rate (reference deterioration coefficient) $\alpha_0$ (S63).

Figure 8A:
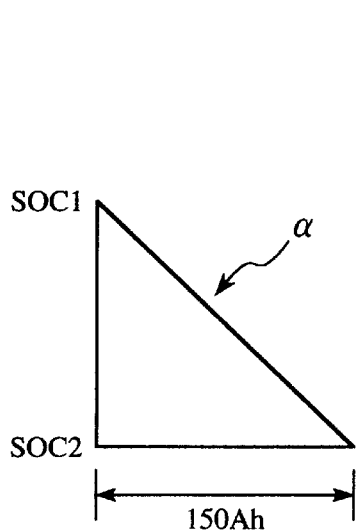
FIG. 8A is a schematic diagram showing the small capacity reduction rate for explaining the operation of the battery deterioration determining unit of the same survivor capacity measuring apparatus for a battery.
Figure 8B:
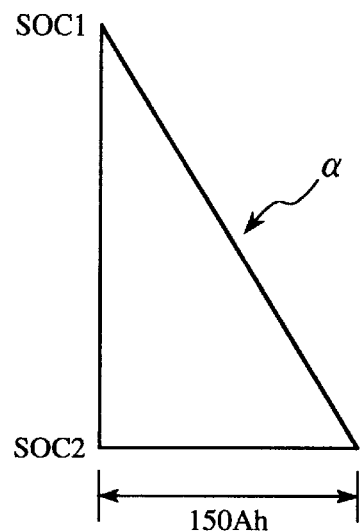
FIG. 8B is a schematic diagram showing the large capacity reduction rate for aid explaining the operation of the battery deterioration determining unit of the same survivor capacity measuring apparatus for a battery.

More concretely, as shown in FIG. 8A and FIG. 8B, the capacity reduction rate α is determined from the degree of inclination which is determined depending on the SOC1, the SOC2 and the time when the integrated current amount k of 150 (Ah) flows.

For instance, in case, as shown in FIG. 8A, the difference between the SOC1 and the SOC2 is small, and the inclination is gentle, the survivor capacity of the battery 3 does not rapidly fall even if the current amount of 150 (Ah) is consumed, and thus, it can be determined that the battery 3 is not deteriorated.

Further, in case, as shown in FIG. 8B, the difference between the SOC1 and the SOC2 is very large, and the inclination is sharp, the survivor capacity of the battery 3 rapidly falls, and thus, it can be determined that the battery 3 is deteriorated.

Next, in case, at Step 63, it is determined that the capacity reduction rate α is large or equal to $\alpha_0$, it is determined at Step 64 whether or not it has been determined one hundred times that the capacity reduction rate α is large or equal to similarly every time (S64).

Next, in case, at Step 64, it is determined that it has been determined one hundred times that the capacity reduction rate α is large or equal to similarly every time, it is determined at Step 65 that the battery is deteriorated (S65), and further, at Step 66, the indication of deterioration is executed (warned) by the use of the indicator 23 (S66).

Figure 9:
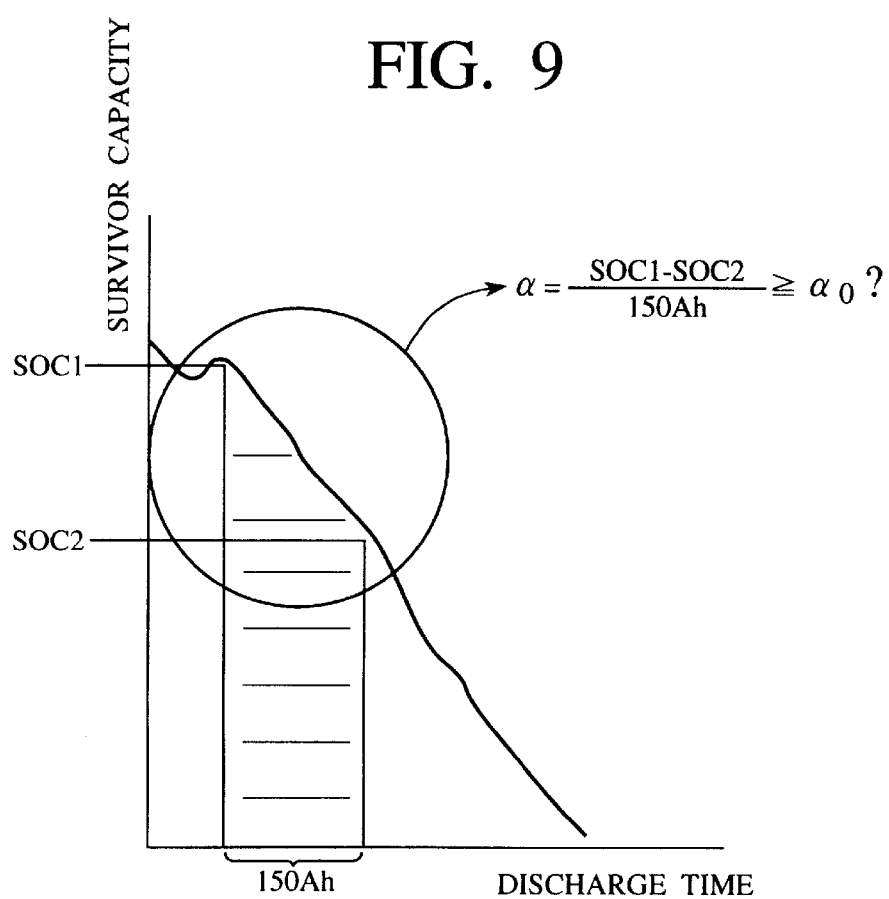
FIG. 9 is a schematic diagram explaining the calculation of the capacity reduction rate of the battery deterioration determining unit of the same survivor capacity measuring apparatus for a battery.

In other words, at Steps 64 to 66 mentioned above, by using SOC1 and SOC2 shown in FIG. 9, a comparison is made between the capacity reduction rate α obtained and the preset reference capacity reduction rate (reference deterioration coefficient) $\alpha_0$, so that, in case it is determined that the capacity reduction rate α is smaller than the preset capacity reduction rate $\alpha_0$, it is not determined that the battery is deteriorated. Further, in case the capacity reduction rate α is larger than the capacity reduction rate $\alpha_0$, it is determined that the battery 3 is deteriorated, when a rapid fall takes place far more often than once or twice.

Further, in case, at Step 63, it is determined that the capacity reduction rate α is smaller and in case, at Step 64, it is not determined one hundred times that the capacity reduction rate α is larger or equal to similarly every time, the processing operation is shifted to Step 20 shown in FIG. 5.

What is claimed is:

1. A survivor capacity measuring apparatus for a battery comprising:

a data read unit reading a current flowing from a battery to a load connected to said battery and a voltage of said battery; and a survivor capacity calculation unit periodically collecting said current and said voltage read by said data read unit, detecting a survivor capacity of said battery on the basis of said current and said voltage both of which are thus collected, integrating said current thus collected, and determining a deterioration of said battery from a first survivor capacity of said battery before said current thus integrated has reached a predetermined amount and a second survivor capacity of said battery after said current thus integrated has reached said predetermined amount, based on a determination that said current thus integrated has reached or exceeded said predetermined amount.

2. A survivor capacity measuring apparatus for a battery according to claim 1, further comprising a regenerative current detection unit detecting generation of a regenerative current, wherein said survivor capacity calculation unit determines whether or not said current integrated thereby has reached said predetermined amount when said generation of said regenerative current is not detected.

3. A survivor capacity measuring apparatus for a battery according to claim 1, wherein said survivor capacity calculation unit determines that said battery is deteriorated, based on a determination that a value resulting from dividing a subtraction value by said predetermined amount of said current integrated by said survivor capacity calculation unit is larger than or equal to a reference value, wherein the value resulting from dividing the subtraction value is obtained by subtracting said second survivor capacity from said first survivor capacity.

4. A survivor capacity measuring apparatus for a battery according to claim 3, wherein said survivor capacity calculation unit determines that said battery is deteriorated based on a determination that said value resulting from said dividing is larger than or equal to said reference value a predetermined number of times.

5. A survivor capacity measuring apparatus for a battery according to claim 1, wherein said survivor capacity calculation unit further comprises:

a first unit obtaining a correlation coefficient between said current and said voltage both of which are collected, obtaining an approximate straight line based on said current and said voltage when said correlation coefficient indicates a strong negative correlation, and obtaining an estimated voltage of said battery which is determined depending on said approximate straight line and a reference current value;

a second unit obtaining said survivor capacity from said estimated voltage; and a third unit determining whether or not said current integrated by said survivor capacity calculation unit has reached or exceeded said predetermined amount based on a determination that said correlation coefficient indicates a strong correlation.

6. A survivor capacity measuring apparatus for a battery according to claim 1, further comprising a regenerative current detection unit detecting generation of a regenerative current, wherein said survivor capacity calculation unit erases, from said current which is integrated by said survivor capacity calculation unit, a value corresponding to said generation of said regenerative current based on a determination that said regenerative current has been detected.

7. A survivor capacity measuring apparatus for a battery according to claim 1, further comprising a regenerative current detection unit detecting generation of a regenerative current, wherein said survivor capacity calculation unit subtracts a value in said survivor capacity which corresponds to said generation of said regenerative current based on a determination that said regenerative current has been detected.

8. A survivor capacity measuring apparatus for a battery according to claim 1, wherein said survivor capacity calculation unit activates a warning indicator based on a determination that said battery is deteriorated.

9. A survivor capacity measuring apparatus for a battery according to claim 1, further comprising an indicator unit indicating an initial capacity of said battery and/or said survivor capacity of said battery.

10. A survivor capacity measuring apparatus for a battery according to claim 9, further comprising a regenerative current detection unit detecting generation of a regenerative current, wherein said indicator unit further indicates occurrence of a regenerative operation corresponding to said generation of said regenerative current.

* * * * *